US012282071B2

(12) United States Patent
Zou et al.

(10) Patent No.: US 12,282,071 B2
(45) Date of Patent: Apr. 22, 2025

(54) PREDICTIVE BATTERY HEALTH DETECTION FROM PACK SOAKING BEHAVIOR

(71) Applicant: GM GLOBAL TECHNOLOGY OPERATIONS LLC, Detroit, MI (US)

(72) Inventors: Yusheng Zou, Northville, MI (US); Ibrahim Haskara, Macomb, MI (US); Bharatkumar Hegde, Bloomfield Hills, MI (US); Chunhao J Lee, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 199 days.

(21) Appl. No.: 18/172,633

(22) Filed: Feb. 22, 2023

(65) Prior Publication Data
US 2024/0175933 A1 May 30, 2024

(30) Foreign Application Priority Data
Nov. 30, 2022 (CN) .......................... 202211517818.1

(51) Int. Cl.
| | |
|---|---|
| G01R 31/392 | (2019.01) |
| B60L 58/16 | (2019.01) |
| G01R 31/3835 | (2019.01) |
| G01R 31/396 | (2019.01) |
| H01M 10/42 | (2006.01) |

(52) U.S. Cl.
CPC ............ *G01R 31/392* (2019.01); *B60L 58/16* (2019.02); *G01R 31/3835* (2019.01); *G01R 31/396* (2019.01); *H01M 2010/4278* (2013.01)

(58) Field of Classification Search
CPC ...... G01R 31/00; G01R 31/36; G01R 31/367; G01R 31/382; G01R 31/3835; G01R 31/392; G01R 31/396; B60L 58/00; B60L 58/10; B60L 58/12; B60L 58/16; (Continued)

(56) References Cited

U.S. PATENT DOCUMENTS

| | | | |
|---|---|---|---|
| 11,714,134 B2 * | 8/2023 | Jo | G01R 31/367 324/431 |
| 11,879,945 B2 * | 1/2024 | Song | G06N 3/045 |

(Continued)

FOREIGN PATENT DOCUMENTS

| | | |
|---|---|---|
| CN | 111566494 A | 8/2020 |
| CN | 115047364 A | 9/2022 |

OTHER PUBLICATIONS

DE Office Action for Appln No. 10 2023 104 214.9, dated Nov. 17, 2023, 7 pages.

*Primary Examiner* — Hoai-An D. Nguyen (74) *Attorney, Agent, or Firm* — CANTOR COLBURN LLP (57) ABSTRACT

A computer-implemented method for predicting a quality of a battery includes receiving a first battery measurement data for a first duration of soaking the battery, the first duration shorter than or equal to the soaking. The method further includes computing a plurality of features based on the first battery measurement data. The method further includes predicting, based on the plurality of features, a state of the battery after completion of the soaking. The method further includes outputting suitability of the quality of the battery based on the state of the battery as predicted.

20 Claims, 4 Drawing Sheets

(58) Field of Classification Search
CPC .... H01M 10/00; H01M 10/42; H01M 10/425; H01M 2010/4278
USPC ........................................ 324/425, 426, 434
See application file for complete search history.

(56) References Cited

U.S. PATENT DOCUMENTS

2021/0091583 A1\* 3/2021 Kamijima ............. H01M 10/48
2023/0076118 A1\* 3/2023 Jo ....................... G01R 31/3648

\* cited by examiner

PREDICTIVE BATTERY HEALTH DETECTION FROM PACK SOAKING BEHAVIOR

CROSS-REFERENCE TO RELATED APPLICATIONS

This application claims priority to Chinese Patent Application No. 202211517818.1, filed Nov. 30, 2022, the contents of which are incorporated by reference herein in their entirety.

INTRODUCTION

The subject disclosure relates to automotive technology, particularly to predicting battery health using machine learning based on pack soaking behavior.

Batteries are electrochemical devices that may include multiple cells that are electrically interconnected to provide electric power to a device, such as an electric machine. Battery cells may develop different electrical characteristics during use that may be quantified in terms of charge capacities, states of charge, discharge rates, impedances, and/or voltages. Imbalance in electrical characteristics between battery cells may affect performance characteristics and service life of a multi-cell battery and also affect the device receiving power from the battery.

A vehicle includes one or more batteries for operating the vehicle's electrical and/or drivetrain systems. For example, a vehicle may include a lead-acid automotive battery configured to supply electric energy to vehicle starter systems (e.g., a starter motor), lighting systems, and/or ignition systems. In some cases, electric vehicles and hybrid vehicles may include a battery to provide power to electric drivetrain components such as electric drive motors.

Testing a battery before it is installed in the vehicle is a resource intensive and time consuming process. Therefore, what is needed is a predictive battery health detection technique, for example, that predicts the battery's health from behavior such as pack soaking behavior.

SUMMARY

According to one or more embodiments, a computer-implemented method for predicting a quality of a battery. The computer-implemented method includes receiving a first battery measurement data for a first duration of soaking the battery, the first duration shorter than or equal to the soaking. The method further includes computing a plurality of features based on the first battery measurement data. The method further includes predicting, based on the plurality of features, a state of the battery after completion of the soaking. The method further includes outputting suitability of the quality of the battery based on the state of the battery as predicted.

In one or more embodiments, the method further includes predicting a second battery measurement data for a second duration, wherein the plurality of features are computed based on the first battery measurement data and the second battery measurement data.

In one or more embodiments, predicting the second battery measurement data is based on the first battery measurement data using a time-series prediction.

In one or more embodiments, the time-series prediction is performed using a Bayesian neural network.

In one or more embodiments, each measurement data comprises a voltage of each cell, an identifier of each cell, and a timestamp corresponding to the measurement data.

In one or more embodiments, the plurality of features comprises a first value A that represents an individual cell voltage drop rates and/or voltage drops across the battery.

In one or more embodiments, the plurality of features comprises a second value B that represents a value of the first value shifted by an average of the first value across all cells in the battery.

In one or more embodiments, the plurality of features comprises a third value C that represents a value of the first value shifted by an average of the first value for a same cell in the battery over the first duration and the second duration.

In one or more embodiments, the plurality of features comprises a fourth value D that represents is computed based on the first value, the second value, and the third value.

In one or more embodiments, the battery is installed in a vehicle based on the suitability of the quality of the battery.

In one or more embodiments, predicting the state of the battery after completion of the soaking comprises predicting a set of outlier cells in the battery based on the features.

In one or more embodiments, the suitability of the quality of the battery is based on the set of outliers predicted.

According to one or more embodiments, a system for predicting a quality of a battery includes a processor comprising a plurality of processing cores, a plurality of sensors coupled with the processor and the battery. The processor is configured to receive a first battery measurement data for a first duration during a soaking of the battery, and predicting the quality of the battery after completion of the soaking by performing a method. The method includes computing a plurality of features based on the first battery measurement data. The method further includes predicting, based on the plurality of features, a state of the battery after completion of the soaking. The method further includes outputting suitability of the quality of the battery based on the state of the battery as predicted.

In one or more embodiments, the method further comprises predicting a second battery measurement data for a second duration, wherein the plurality of features are computed based on the first battery measurement data and the second battery measurement data, and wherein predicting the second battery measurement data is based on the first battery measurement data using a time-series prediction.

In one or more embodiments, each measurement data in the first battery measurement data and the second battery measurement data comprises a voltage of each cell, an identifier of each cell, and a timestamp corresponding to the measurement data.

In one or more embodiments, the battery is installed in a vehicle based on the suitability of the quality of the battery.

In one or more embodiments, predicting the state of the battery after completion of the soaking comprises predicting a set of outlier cells in the battery based on the features.

According to one or more embodiments, a computer program product comprising a non-transitory memory device that has one or more computer executable instructions stored thereon, and which are executable by one or more processing units to perform a method for predicting a quality of a battery. The method includes receiving a first battery measurement data for a first duration of soaking the battery. The method further includes computing a plurality of features based on the first battery measurement data. The method further includes predicting, based on the plurality of features, a state of the battery after completion of the soaking. The method further includes outputting suitability of the quality of the battery based on the state of the battery as predicted.

In one or more embodiments, the method further comprises predicting a second battery measurement data for a second duration, the plurality of features are computed based on the first battery measurement data and the second battery measurement data, and wherein predicting the second battery measurement data is based on the first battery measurement data using a time-series prediction.

In one or more embodiments, predicting the state of the battery after completion of the soaking comprises predicting a set of outlier cells in the battery based on the features, and wherein the suitability of the quality of the battery is based on the set of outliers predicted.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

In accordance with an exemplary embodiment, a system and method are disclosed for predictive battery health detection from pack soaking behavior. Embodiments of one or more technical solutions described herein create unique features (independent data dimensions) during a battery pack soaking period to detect battery concerns at their onset, independent of time of the sample, to improve accuracy and identify earlier (in comparison to present techniques) adverse health conditions of a battery. Technical solutions described herein facilitate using a predictive analyzer to forecast future soaking behavior of the battery pack, in order to make early determination of health-defect in the battery pack.

During manufacturing of a battery, and prior to assembly of the battery in a vehicle, the battery undergoes a process called "soaking." Such a soaking period ensures stable battery performance characteristics. The soaking period is a period of time after battery cells are assembled into a battery pack, so that any mechanical influences and other impacts that may have occurred during the manufacturing and assembly of the battery pack are developed and reflected in the operation of the battery. For example, excessive discharge and, thus, excessive drop in battery cell(s) voltage, which is a measurable quantity can be one symptom caused by such occurrences. The conventional method of testing the battery isolates this behavior on a single cell basis (i.e., each cell is checked against predetermined values). Embodiments of the technical solutions described herein provide an improvement by using machine learning to predict effects on the entire battery pack level, where the features (that have high dimensions) enable the consideration of interrelationship between cells.

Figure 1:
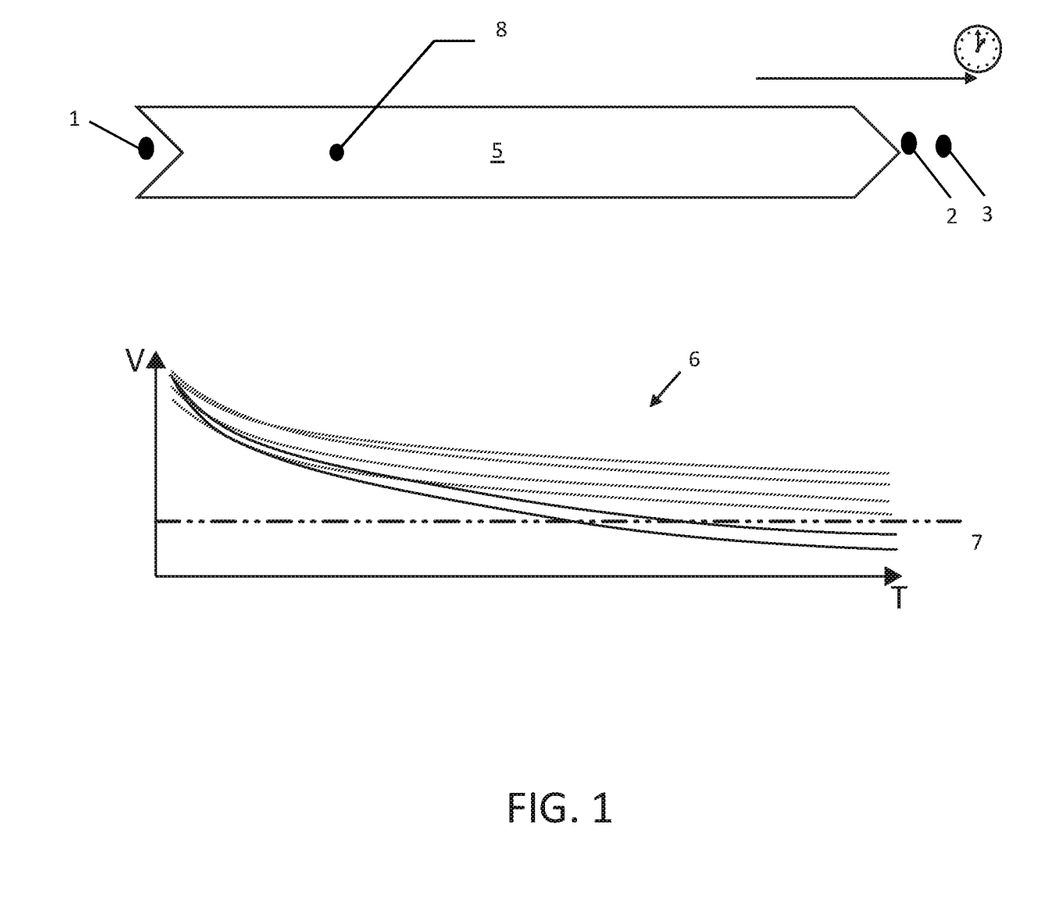
FIG. 1 depicts a soaking process being performed for a battery according to one or more embodiments.

FIG. 1 depicts a soaking process being performed for a battery according to one or more embodiments. A battery is manufactured at a first timepoint T1 1, after which a soaking process 5 is performed. The soaking process 5 takes a predetermined duration that lasts until timepoint T2 2, T2>T1. For example, the soaking process can take X number of days, weeks, hours, etc. Starting at T1, and until T2, battery voltages of each individual cell in the battery being soaked are measured at predetermined frequency (e.g., every hour, every M minutes, every day, etc.). The chart 6 depicts some example battery voltages (Y axis) over time (X axis) measured for one or more cells of the battery under soaking 5.

The empirical curves in the chart 6 (typically, obtained from a supplier of the battery) are used manually to track voltage drop of each individual cell in the battery during battery soaking. If the voltage is below a predetermined threshold 7, the battery is deemed to be defective and is not installed in a vehicle at timepoint T3 3. Alternatively, if the voltage drops satisfy the threshold 7, the battery is deemed to be installable in the vehicle at T3 3. For example, if voltage drop rate is more than (or equal to) a predetermined threshold, then it indicates that the cell is not keeping initial charge, and needs further inspection, and if the drop is less than (or equal to) the predetermined threshold, the cell's behavior is acceptable. This present state-of-the-art method that uses the empirical curves to detect the defects in a battery is slow, inaccurate, and not robust.

Figure 2:
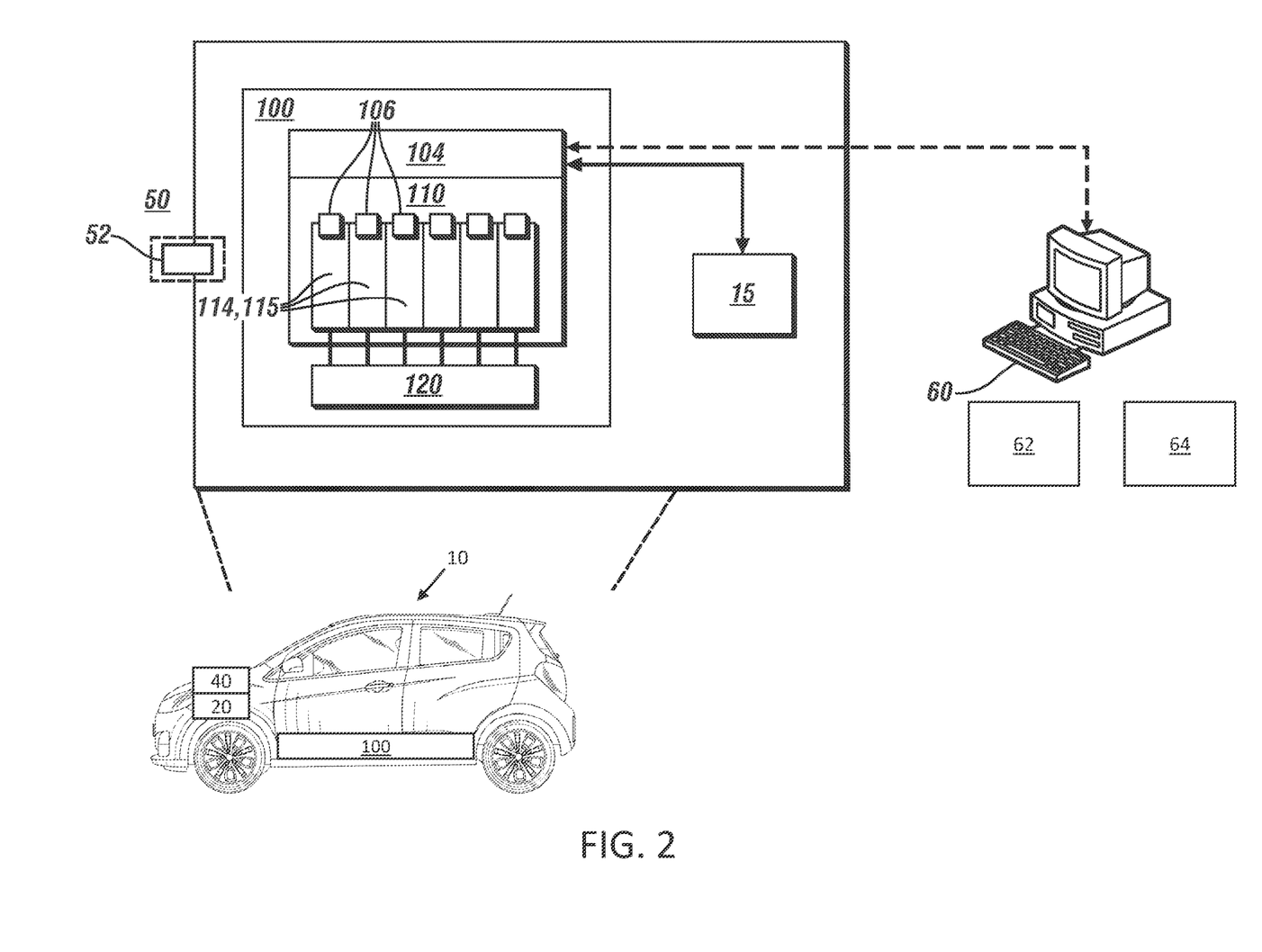
FIG. 2 illustrates a vehicle that includes a drivetrain and a battery system according to one or more embodiments.

FIG. 2 illustrates a vehicle 10 that includes a drivetrain 20 and a battery system 100 that is illustrative of the concepts described herein. One or more operations of the vehicle 10 are controlled by a vehicle controller 15. In one embodiment, the vehicle 10 includes a control system 40. In some embodiments, the control system 40 may facilitate one or more autonomous driving features of the vehicle 10. Alternatively, the vehicle 10 may be a non-autonomous vehicle. The vehicle 10 may be, by way of non-limiting examples, a passenger vehicle, a light-duty or heavy-duty truck, a utility vehicle, an agricultural vehicle, an industrial/warehouse vehicle, a recreational off-road vehicle, an airplane, or a marine vehicle.

The drivetrain 20 of the vehicle 10 may be configured as an electric vehicle (EV), a hybrid vehicle (HV) that includes an internal combustion engine ("ICE"), or any other configuration. The battery system 100 facilitates supply of electric power to one or more electrical components of the drivetrain 20.

The control system 40 includes an on-vehicle control system that is capable of providing one or more driving automation features. Driving automation can include some level of automatic control or intervention related to a vehicle operation/function, such as steering, acceleration, and/or braking. The driver/operator may/may not have continuous control of the vehicle 10 during such driving automation. The driving automation can facilitate automation of a single vehicle function or a simultaneous control of multiple vehicle functions. Driving automation includes hardware and controllers configured to monitor one or more spatial environment and to perform various driving tasks during such dynamic operation. Driving automation can include, by way of non-limiting examples, cruise control, adaptive cruise control, lane-change warning, intervention and control, automatic parking, acceleration, braking, and the like.

The vehicle 10 includes an electrical charging system 50 for electrically charging battery cells 115 of the battery system 100. The electrical charging system 50 includes, in one embodiment, a charger 52 that is electrically couplable to an off-vehicle electrical power supply (not shown) that may be available at a public or private charging station. The electrical power supply may be arranged to supply electrical power to charge the battery system 100 via the electrical charging system 50. The supplied electrical power may be in the form of AC power or DC power.

The battery system 100 includes, in one embodiment, a battery pack 110, a battery pack controller 104, and a plurality of sensors 106. The battery pack 110 may be arranged as a multi-cell high-voltage battery system including a plurality of the battery cells 115 that are electrically connected in series or in parallel to provide electrical power to an actuator, such as an electric machine. The battery cells 115 may be arranged in one or more battery sections 114 that are sized to provide electrical power at a desired voltage and a desired current to a system of the vehicle 10 (e.g., the drivetrain 20). Each of the battery cells 115 may employ rechargeable electrochemical battery technology including, for example, lead-acid, nickel-metal hydride ("NiMH"), lithium-ion ("Li-Ion"), Li-Ion polymer, lithium-air, nickel-cadmium ("NiCad"), valve-regulated lead-acid ("VRLA") including absorbed glass mat ("AGM"), nickel-zinc ("NiZn"), molten salt (e.g., a ZEBRA battery), and/or other battery technologies.

The sensors 106 are arranged to measure electrical parameters associated with the battery cells 115. In one embodiment, each of the sensors 106 is a voltmeter or an ammeter. In some embodiments, each of the sensors 106 may be respectively associated with each of the battery cells 115, or with each of the battery sections 114. State of charge information may be determined based upon the measured electrical parameters from the sensors 106. The determined state of charge may be provided to the battery pack controller 104. Using the state of charge information, the battery pack controller 104 may operate to coordinate battery operations, such as balancing.

Each of the battery cells 115 or battery sections 114 may be in communication with a cell balancing system 120. The cell balancing system 120 may include a network of switches and/or gates that are configured to facilitate selective electrical energy transfer to, from, and/or between the battery cells 115. The cell balancing system 120 may balance the battery cells 115 of the battery pack 110 by charging individual ones of the battery cells 115 and/or discharging individual ones of the battery cells 115, such that each of the battery cells 115 has the same or similar quantum of energy stored therein, as indicated by a state of charge measurement or a voltage measurement.

The battery system 100 includes the battery pack controller 104, which may be configured to monitor and control certain operations of the battery system 100. For example, the battery pack controller 104 may be configured to monitor information from the plurality of sensors 106 and control operations of the electrical charging system 50 and the cell balancing system 120 to control charging, discharging, and/or balancing operations of the battery system 100. The battery pack controller 104 may further be configured to provide information to and/or receive information from other systems included in the vehicle 10. For example, the battery pack controller 104 may be communicatively coupled with the vehicle controller 15 and/or a remotely located external computer system 60 via a telematics system (not shown). In certain embodiments, the battery pack controller 104 may be configured, at least in part, to provide information regarding the battery system 100 to a user of the vehicle 10, the vehicle controller 15, and/or the external computer system 60. Such information may include, for example, battery state of charge information, battery operating time information, battery operating temperature information, and/or other information regarding the battery system 100.

Further, while the battery system 100 is shown to be installed in the vehicle 10, in some embodiments, the battery system 100 can be only in communication with the computer system 60, which tests the battery system 100 before installation of the battery system 100 into the vehicle 10. For example, the computer system 100 may monitor one or more parameters of the battery system 100 (e.g., cell voltage) in a continuous (or periodic) manner to determine if the battery system 100 is defective (or not), and thus, suitable for installation in the vehicle 10.

For example, the computer system 60 may determine states of charge of each of the battery cells 115 to detect/predict if the battery system 100 is defective. Voltages of each of the battery cells 115 may be employed as indicators of the states of charge, and thus the health of the battery system 100. Other parameters or a combination thereof may be used in some embodiments to determine state of the battery system 100. For example, rate of energy input to reach a desired state of charge balance for the battery system 100 may be calculated for each of the plurality of sections. The of rate of energy may be expressed in terms of ampere-hours ("AHr"). For example, if the estimated states of charge and/or the calculated quanta of energy are equivalent, within an allowable range of error, it may be determined that the battery cells 115 are not defective (sometimes referred to as "balanced"). If, however, the battery cells 115 are unbalanced, the battery system 100 may be deemed to be unsuitable for installation (at T3 3). Such a battery system may be repaired and re-tested before installation, for example. Thus, cell balancing is used to judge if the battery is defective (or not) using technical solutions described herein.

Alternatively, or in addition, embodiments herein use excessive discharge measured across the battery cells 115 to predict if the battery system 100 is defective (or not). For example, if manufacturing effects cause voltage drop above a predetermined threshold in a cell, which is detected during or after the soaking period, the cell may be deemed to be unsuitable. The existing testing techniques consider cell voltages, and the voltage drops individually (i.e., per cell). If the cell voltage measurements and cell voltage drop measurements are within a specified range for each cell, the battery passes the quality check at the end of the soaking period. Embodiments of the technical solutions herein facilitate an improvement by predicting the cell voltage measurements and cell voltage drops during and after the soaking period based on an initial set of measurements. Accordingly, embodiments of the technical solutions herein can predict the suitability of the battery before the soaking period is completed (i.e., without having to complete the soaking period).

As noted herein, the present techniques to determine if the battery system 100 is suitable for installation (i.e., not defective) are based on empirical curves of the measured states of charge (e.g., voltages) of each cell 115 of the battery system before and after the soaking process 5. The voltage drops from before and after the soaking process 5 are compared to predefined drop values (e.g., nominal discharge curve). Thus, the entire soaking process 5 has to be completed, which extends production timeline, and moreover, these techniques are not robust and accurate.

The technical solutions herein address such technical challenge by using a machine learning model to predict if a battery system 100 would be suitable for installation at time T3 3 at or before completion of the soaking process (e.g., at timepoint T4 8 in FIG. 1, which occurs on or before T2 2). Accordingly, the entire soaking process 5 does not have to be performed, saving time as well as resources spent in the soaking process 5. Embodiments of the technical solutions facilitate the machine learning model to use charge state measurements (e.g., voltages) of the cells 115 over a shorter duration (e.g., T4−T1, which is equal to or shorter than T2−T1) to predict the charge state at T2 2 (at T4, before T2 occurs). In some embodiments, the machine learning model predicts a time series data to predict voltage drops of the cells 115 of the battery system 100, and uses these predicted voltage drops to compute the predicted voltage at T2 2 or other timepoint between T4 8 and T2 2. The predicted time series data can represent estimated voltage measurements for a predetermined duration, for example, the entire soaking process 5.

Figure 3:
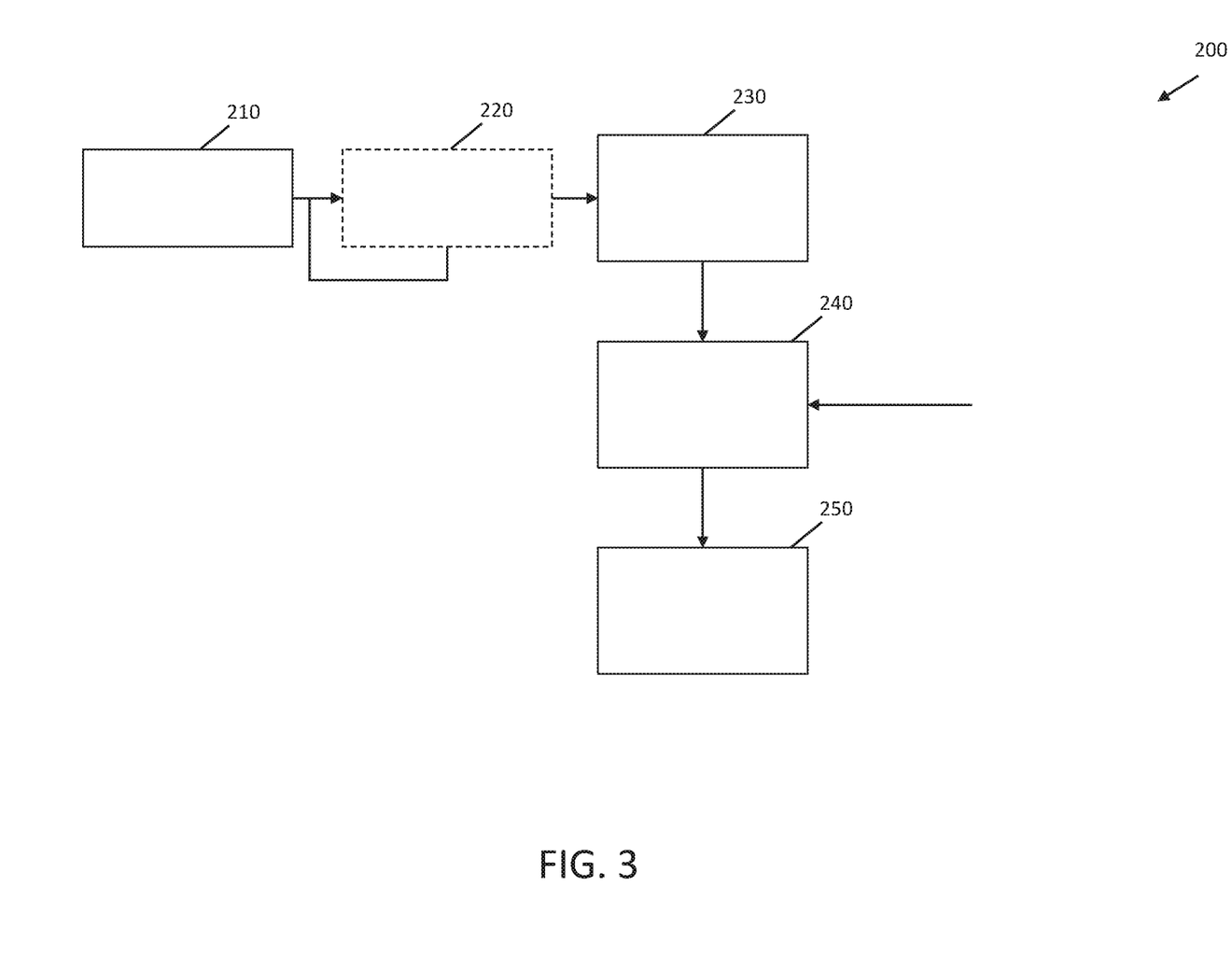
FIG. 3 depicts a flowchart of a method for predicting battery state measurement after a soaking process according to one or more embodiments.

FIG. 3 depicts a flowchart of a method for predicting battery state measurement after a soaking process according to one or more embodiments. The method 200 can be performed by the external computer device 60 in one or more embodiments. The computer device 60 monitors the battery system 100 after manufacture and during the soaking process 5.

The method 200 includes receiving, by the computer device, battery measurement data, at block 210. The battery measurement data can include, but is not limited to voltage of the cells 115 of the battery system 100 that is undergoing the soaking process 5. The battery measurement data also includes timestamps at which the measurements have been taken (e.g., day, time of day, etc.). Further, the battery measurement data includes an index (i.e., identifier) of each cell 115 for which the corresponding voltage is measured. The battery measurement data can be represented as a series $V_1, V_2, \ldots, V_k$, where the suffix represents a timepoint at which the measurement is captured. In some embodiments, the battery measurement data $V_1, V_2, \ldots, V_k$, is captured for a predetermined duration, for example, from T1 1 to T4 8 (i.e., T4−T1).

Further, at block 220, in some embodiments, the captured battery measurement data is used to compute predicted battery measurement data. The voltages in the captured series are used to predict voltages of the cells 115 $\tilde{V}_{k+1}, \ldots \tilde{V}_{k+j}$. Here, $\tilde{V}$ represents a predicted battery measurement data, and the suffix continues to represent a timestamp. Accordingly, a time-ahead predictor 62 (FIG. 2) is used to predict battery soaking behavior over a second duration (i.e., T2-T4), based on captured battery measurement data over the first duration (i.e., T4−T1). The time-ahead predictor 62 can be any time series estimator based on machine learning (or artificial intelligence), such as a Bayesian neural network, a feed-forward network, a recurrent neural network, etc. In various embodiments, the machine learning model used for the time series estimation can vary in the number of layers (e.g., three, four, etc.), the number of neurons in each layer, the training algorithm used (e.g., unsupervised, supervised, extended Kalman filter, etc.), and any other attribute(s). it should be noted that the prediction of the battery measurement data for the battery system 100 over the second duration is predicted based on the captured battery measurement data for the same battery system 100 during the first duration.

At block 230, the computer device 60 computes features for inputting to a machine learning model 64 (FIG. 2) to predict post-soaking battery state. In some embodiments, the machine learning model 64 uses the time series data, which includes the battery measurement data captured in the first duration (i.e., $V_1, V_2, \ldots, V_k$). In some embodiments, which include computing the predicted battery measurement data (220), the time series data used by the machine learning model 64 also includes the battery measurement data that is predicted for the second duration (i.e., $\tilde{V}_{k+1} \ldots \tilde{V}_{k+j}$) by the time-ahead estimator 62. The "features" that are computed include intermediate values that are computed as inputs to the machine learning model 64 to predict a state of the battery system 100 at the time T3 3. Here, T3 is known because that is when the soaking process 5 is scheduled to end. The features are computed using the battery voltages, time, cell relationships, temperatures, etc., which are stored as part of the battery measurement data (captured, and predicted).

In some embodiments, the features computed include a voltage matrix V[i, k], where i represents a cell index (in the battery system 100), and k represents a timepoint of the measurement. In some examples, k can be a day index where a sample of the battery measurement data is captured (or predicted) per day.

Further, the features include a $$\underset{cell}{\mathrm{mean}}(V[i, 0]),$$

which represents an average initial cell voltage (at timepoint T1, before the soaking process 5). Further, the features can include dV[i, k], which represents voltage drop for cell i on day k from the initial cell voltages on the first day. Further, the features include dV dT [i, k], which represents average cell voltage drop rate for cell i on day k from first day per number of days.

In some embodiments, based on the above features/computations, further features A, B, C, D (FIG. 4) are computed.

Figure 4:
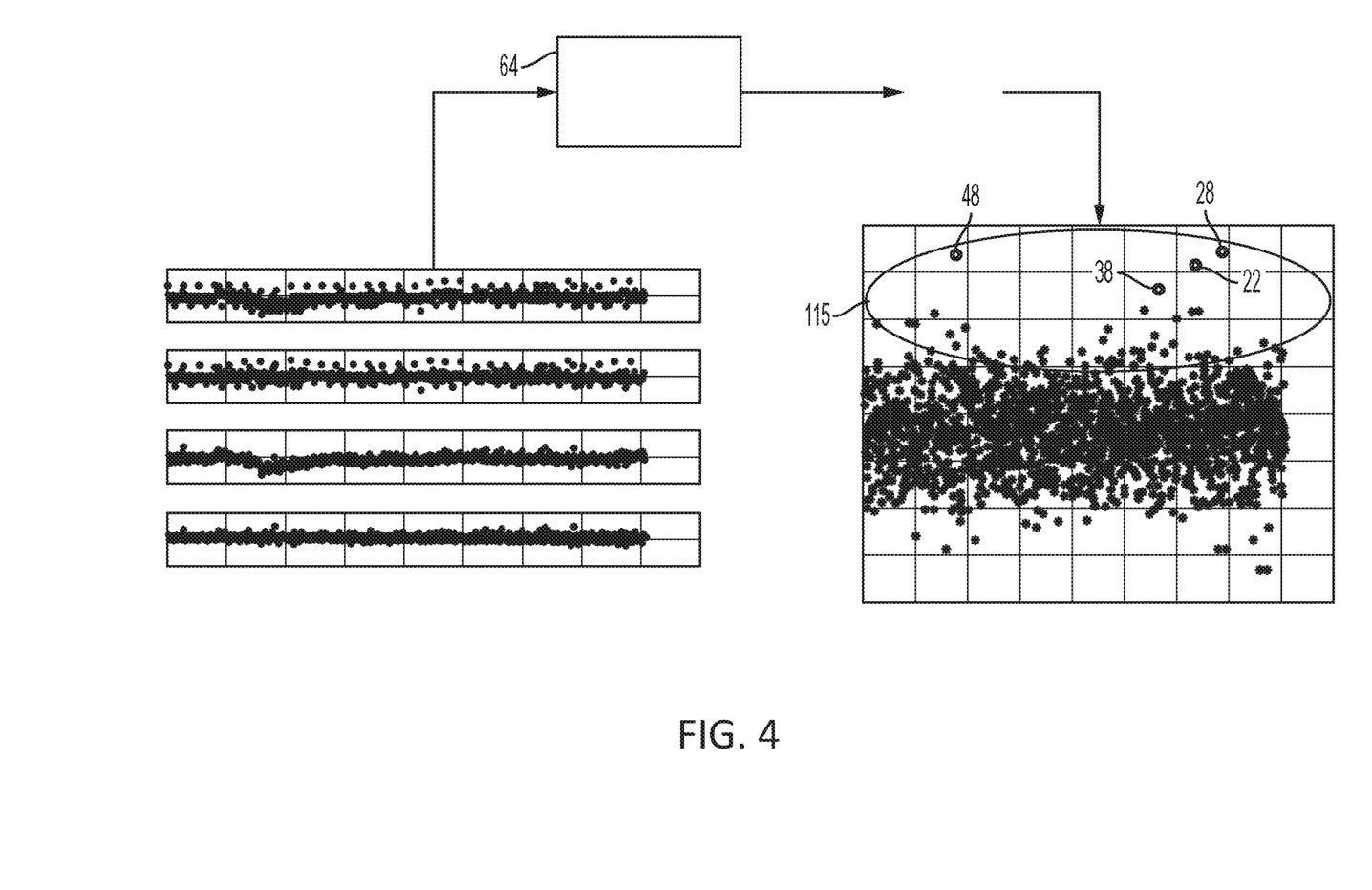
FIG. 4 depicts a visualization of the machine learning model receiving one or more computed features as input and outputting identifications of one or more cells in a battery system being tested according to one or more embodiments.

Here, A represents individual cell voltage drop rates and/or individual cell voltage drops. In some embodiments, each $i^{th}$ value serves as an independent feature (or dimension) in the machine learning model 64.

$$A = dVdT[i,k] \text{ and/or } A = dV[i,k]$$

In some embodiments, an average-A for the battery system 100 over cells 115 (total cell count in battery system 100=N) can be computed using an identity matrix I as:

$$A\_pack\_ave = A*I(N)/N$$

Further, same cell average over several battery systems 100 (say, total number of battery systems=M) can be computed as:

$$A\_samecell\_ave = I(M) * A/M$$

Further, an intermediate value B is computed using A to represent A shifted by the A_pack_ave as:

$$B = A - A\_pack\_ave$$

$$B = A - A*I(N)/N$$

Another intermediate value C is computed using A to represent A shifted by A_samecell_ave as:

$$C = A - A\_samecell\_ave$$

$$C = A - I(M)*A/M$$

Further yet, a feature D is computed using A, B, and C, as:

$$D = A - A*I(N)/N - I(M)*A/M + I(M)*A*I(N)/M/N$$

At block 240, the computed features (e.g., A, B, C, D) are input to the machine learning model 64. The machine learning model 64 may be calibrated with one or more attributes to identify outliers among the battery measurement data (captured and predicted) based on the input features. The machine learning model 64 is also pre-trained to identify the outliers based on training datasets. Such training is performed in an off-line manner, prior to using the machine learning model 64. The machine learning model 64 can be implemented using an architecture used for implementing a (artificially intelligent) classifier, such as support vector machine (SVM), logistic regression, artificial neural network (ANN), etc. The machine learning model 64 can be trained using any techniques such as supervised, unsupervised, semi-supervised, reinforcement learning, etc. It should be noted that other embodiments of the technical solutions herein are not limited to the number of features, or the features themselves described herein, and that A, B, C, and D are examples used herein.

While some of the features used by the machine learning model(s) are described above, it is understood that the machine learning model(s) can use several other features in one or more embodiments. A non-exhaustive list of examples of such features includes: cell voltages, cell voltage drops from first day, cell voltage drops from previous measurement, cell voltage drops from n-th previous measurement in a moving time window, cell voltage drop rates from first day, cell voltage drop rates from previous measurement, cell voltage drop rates from n-th previous measurement in a moving time window, initial cell voltages, voltage ranges, averages of above values in pack, module, time window, averages of above values across packs, module, time window, above values with compensations, 95th and other percentile of above values, other statistical values on cell, module, and pack level (sum, std dev, median, Q1, Q3, etc.), extreme values (max, min, etc.), time, time elapsed, temperatures, etc.

At block 250, based on the input features, the machine learning model 64 outputs a prediction if the battery system 100 would be suitable for installation in the vehicle 100. In some embodiments, a voltage $V_k$ is measured for a targeted timepoint k, which occurs any time after T1, but on or before T2) using the measurements obtained (directly). $V_k$ is used to predict the state of the battery system 100 at time T2 2. In other embodiments, which include computing the predicted battery measurement data (220), the prediction is based on a predicted voltage value $\tilde{V}_{k+x}$ for a targeted timepoint k+x since the first day (of the soaking 5). Here, the prediction $\tilde{V}_{k+x}$ is computed using the measurements obtained (directly) and the predicted measurements from the predictor 62. The machine learning model 64 identifies one or more outlier cells that are predicted to be inadequate or that fail to satisfy the quality check constraints. FIG. 4 depicts a visualization of the machine learning model 64 receiving the one or more computed features as input and outputting identifications of one or more cells in the battery system 100 being tested, the cells being deemed to be outliers based on the input features. In one or more embodiments, depending on the number of cells 115 (e.g., 5, 10, 20, etc.) in a battery system 100 identified as being outliers, the battery system 100 may be determined as being suitable/unsuitable for the installation. In some cases, a proportion of outlier cells 115 to number of non-outlier cells (i.e., those that satisfy the outlier constraints) in the battery system 100 may be used to determine the suitability for installation.

In other embodiments, the machine learning model may predict, as outputs, same values on the entire battery level (rather than each individual battery cells 115). The prediction on the entire battery level can be computed by aggregating the values for each battery cell 115. For example, the aggregation can be represented using statistical computations, such as average, median, standard deviation, or any other statistical aggregation. Alternatively, or in addition, other the machine learning model is trained to output battery level predictions based on the training data used. If the battery pack predictions, based on the input features, satisfy the outlier constraints, the battery system 100 may be determined to be suitable (or unsuitable) for the installation.

Alternatively, or in addition, depending on particular cells 115 being identified as the outliers, the battery system 100 may be deemed as suitable/unsuitable for the installation. For example, if cell id #s 10, 20, 30 are identified as outliers, the battery system 100 is deemed unsuitable for installation. It is understood that the above is just an example list of cell identifiers, and any other cell identifier can be used in one or more embodiments. The list of cell identifiers to check for outliers can be predetermined based on the type of the battery system 100 and/or the vehicle 10 in which the installation is to be performed.

Based on the prediction from the machine learning model 64, the battery system 100 is either installed or not in the vehicle 100. In one or more embodiments, the machine learning model 64 outputs a notification indicating suitability/unsuitability of each battery system 100 that is undergoing the soaking process 5. In some embodiments, the battery systems 100 that are deemed to be unsuitable can be removed from the soaking process 5 to save resources. In some cases, such battery systems 100 can be repaired and retested using the technical solutions described herein.

Technical solutions described herein facilitate using a predictive battery soaking analyzer to predict quality of a battery system before completing the soaking process. The technical solutions herein facilitate augmenting a time-ahead predictor for battery soaking behavior. Further, the technical solutions herein use up-to-date real measurements and time-ahead prediction together to predict battery states ahead of time, and further predict if the battery would be suitable for installation in a vehicle. The technical solutions herein provide an improvement to the present process of checking the quality of the battery, which requires that the entire soaking process be completed. The technical solutions address such technical challenges by using machine learning model that are input features (independent data dimensions) from the battery soaking period to detect battery states at the onset, independent of time of the sample, to improve accuracy and to make early determination of the battery quality. Accordingly, embodiments of the technical solutions herein provide a practical application that uses the predictive analyzer to forecast future soaking behavior of the battery, in order to make early determination of the quality of the battery.

It should be noted that while the battery and its quality check is described in the context of a vehicle in which the battery is installed and used as a power source, technical solutions described herein can be used for any battery that may be used for purposed other than those in a vehicle.

As used herein, the term "controller" and related terms such as microcontroller, control module, module, control, control unit, processor and similar terms refer to one or various combinations of Application Specific Integrated Circuit(s) (ASIC), Field-Programmable Gate Array (FPGA), electronic circuit(s), central processing unit(s), e.g., microprocessor(s) and associated non-transitory memory component(s) in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning and buffer circuitry and other components that can be accessed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms, and similar terms mean controller-executable instruction sets including calibrations and look-up tables. Each controller executes control routine(s) to provide desired functions. Routines may be executed at regular intervals, for example each 100 microseconds during ongoing operation. Alternatively, routines may be executed in response to occurrence of a triggering event. Communication between controllers, and communication between controllers, actuators and/or sensors may be accomplished using a direct wired point-to-point link, a networked communication bus link, a wireless link, or another suitable communication link. Communication includes exchanging data signals in suitable form, including, for example, electrical signals via a conductive medium, electromagnetic signals via air, optical signals via optical waveguides, and the like. The data signals may include discrete, analog, or digitized analog signals representing inputs from sensors, actuator commands, and communication between controllers.

The terms "a" and "an" do not denote a limitation of quantity, but rather denote the presence of at least one of the referenced item. The term "or" means "and/or" unless clearly indicated otherwise by context. Reference throughout the specification to "an aspect," means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

As used herein, the term "system" may refer to a combination or collection of mechanical and electrical hardware, software, firmware, electronic control componentry, processing logic, and/or processor device, individually or in combination, including without limitation: application specific integrated circuit (ASIC), an electronic circuit, a processor (shared, dedicated, or group) that executes one or more software or firmware programs, memory to contain software or firmware instructions, a combinational logic circuit, and/or other components that provide the described functionality.

Unless specified to the contrary herein, all test standards are the most recent standard in effect as of the filing date of this application, or, if priority is claimed, the filing date of the earliest priority application in which the test standard appears.

Unless defined otherwise, technical, and scientific terms used herein have the same meaning as is commonly understood by one of skill in the art to which this disclosure belongs.

While the above disclosure has been described with reference to exemplary embodiments, it will be understood by those skilled in the art that various changes may be made, and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A computer-implemented method for predicting a quality of a battery having multiple cells, the computer-implemented method comprising:
   receiving a first battery measurement data from a plurality of sensors coupled with the battery for a first duration of time, wherein the first duration of time is shorter than a total duration of soaking the battery;
   computing a plurality of machine learning features based on the first battery measurement data;
   predicting, based on the plurality of machine learning features, a state of the battery during a second duration of time, the plurality of machine learning features being defined by the first battery measurement data;
   receiving a second battery measurement data from the plurality of sensors for the second duration of time, the second duration of time being subsequent to the first duration of time, and the second duration of time being within the total duration of soaking the battery;
   comparing the predicted state of the battery during the second duration of time to the received second battery measurement data; and
   outputting suitability of the quality of the battery based on the state of the battery as predicted.

2. The computer-implemented method of claim 1, wherein the second duration of time is shorter than or equal to a difference between the first duration of time and the total duration of soaking the battery, further comprising predicting a second battery measurement data for a second duration, wherein the plurality of machine learning features are computed based on the first battery measurement data and the second battery measurement data.

3. The computer-implemented method of claim 2, wherein predicting the second battery measurement data is based on the first battery measurement data using a time-series prediction.

4. The computer-implemented method of claim 3, wherein the time-series prediction is performed using a Bayesian neural network.

5. The computer-implemented method of claim 1, wherein each measurement data comprises a voltage of each cell, an identifier of each cell, and a timestamp corresponding to the measurement data.

6. The computer-implemented method of claim 5, wherein the plurality of machine learning features comprises a first value A that represents an individual cell voltage drop rates and/or voltage drops across the battery.

7. The computer-implemented method of claim 6, wherein the plurality of machine learning features comprises a second value B that represents a value of the first value shifted by an average of the first value across all cells in the battery.

8. The computer-implemented method of claim 7, wherein the plurality of machine learning features comprises a third value C that represents a value of the first value shifted by an average of the first value for a same cell in the battery over the first duration and a second duration.

9. The computer-implemented method of claim 8, wherein the plurality of machine learning features comprises a fourth value D that represents is computed based on the first value, the second value, and the third value.

10. The computer-implemented method of claim 1, wherein the battery is installed in a vehicle based on the suitability of the quality of the battery.

11. The computer-implemented method of claim 1, wherein predicting the state of the battery after completion of the soaking comprises predicting a set of outlier cells in the battery based on the features.

12. The computer-implemented method of claim 11, wherein the suitability of the quality of the battery is based on the set of outlier cells predicted.

13. A system for predicting a quality of a battery having multiple cells, the system comprising:
 a processor comprising a plurality of processing cores;
 a plurality of sensors coupled with the processor and the battery, wherein the processor is configured to receive a first battery measurement data from the plurality of sensors for a first duration of time during a soaking of the battery, and predicting the quality of the battery after completion of the soaking by performing a method comprising:
 computing a plurality of machine learning features based on the first battery measurement data;
 predicting, based on the plurality of machine learning features, during a second duration of time, the plurality of machine learning features being defined by the first battery measurement data;
 receiving a second battery measurement data from the plurality of sensors for the second duration of time, the second duration of time being subsequent to the first duration of time, and the second duration of time being within the total duration of soaking the battery;
 comparing the predicted state of the battery during the second duration of time to the received second battery measurement data; and
 outputting suitability of the quality of the battery based on the state of the battery as predicted.

14. The system of claim 13, wherein the method further comprises predicting a second battery measurement data for a second duration, wherein the plurality of machine learning features are computed based on the first battery measurement data and the second battery measurement data, and wherein predicting the second battery measurement data is based on the first battery measurement data using a time-series prediction.

15. The system of claim 14, wherein each measurement data in the first battery measurement data and the second battery measurement data comprises a voltage of each cell, an identifier of each cell, and a timestamp corresponding to the measurement data.

16. The system of claim 13, wherein the battery is installed in a vehicle based on the suitability of the quality of the battery.

17. The system of claim 13, wherein predicting the state of the battery after completion of the soaking comprises predicting a set of outlier cells in the battery based on the features.

18. A computer program product comprising a non-transitory memory device that has one or more computer executable instructions stored thereon, and which are executable by one or more processing units to perform a method for predicting a quality of a battery, the method comprising:
 receiving a first battery measurement data from a plurality of sensors coupled with the battery for a first duration of time, wherein the first duration of time is shorter than a total duration of soaking the battery;
 computing a plurality of machine learning features based on the first battery measurement data;
 during a second duration of time, the plurality of machine learning features being defined by the first battery measurement data;
 receiving a second battery measurement data from the plurality of sensors for the second duration of time, the second duration of time being subsequent to the first duration of time, and the second duration of time being within the total duration of soaking the battery;
 comparing the predicted state of the battery during the second duration of time to the received second battery measurement data; and
 outputting suitability of the quality of the battery based on the state of the battery as predicted.

19. The computer program product of claim 18, wherein the method further comprises predicting a second battery measurement data for a second duration, the plurality of machine learning features are computed based on the first battery measurement data and the second battery measurement data, and wherein predicting the second battery measurement data is based on the first battery measurement data using a time-series prediction.

20. The computer program product of claim 18, wherein predicting the state of the battery after completion of the soaking comprises predicting a set of outlier cells in the battery based on the features, and wherein the suitability of the quality of the battery is based on the set of outliers predicted.

* * * * *